United States Patent [19]

Tso et al.

[11] Patent Number: 4,940,509

[45] Date of Patent: Jul. 10, 1990

[54] ISOTROPIC ETCHANT FOR CAPPED SILICIDE PROCESSES

[75] Inventors: Stephen T. Tso, Dallas; David L. Bouldin, Allen; Mark R. Calley, Dallas; Charlotte M. Tipton, Allen, all of Tex.

[73] Assignee: Texas Instruments, Incorporated, Dallas, Tex.

[21] Appl. No.: 173,513

[22] Filed: Mar. 25, 1988

[51] Int. Cl.$^5$ .................. C03C 15/00; C23F 1/02; C09K 13/00
[52] U.S. Cl. .................. 156/653; 156/656; 156/657; 252/79.1; 252/79.2
[58] Field of Search .................. 437/59, 200, 192, 195, 437/201, 202, 203; 156/657, 653, 664, 656; 252/79.2, 79.1

[56] References Cited

U.S. PATENT DOCUMENTS 4,551,908  11/1985  Nagasawa et al. ............ 437/59 X
4,690,730   9/1987  Tang et al. .................. 156/643

OTHER PUBLICATIONS

Ghandhi, VLSI Fabrication Principles, John Wiley & Sons, 1983, pp. 420–439.
Park et al, J. Vac. Sci. Technol., A2(2), Apr.–Jun. 1984, pp. 259–263.
Tseng et al, IEEE Electron Device Letters, vol. ED-L-7, No. 11, Nov. 1986, pp. 623–624.
Lin et al, J. Electrochemical Soc., vol. 133, No. 11, Nov. 1986, pp. 2386–2389.
W. van Gelder et al., "The Etching of Silicon Nitride in Phosphoric Acid with Silicon Dioxide as a Mask" *J. Electrochem Soc.: Solid State Science* vol. 114, No. 8, p. 869, Aug. 1967.
PUB. No. 15A110-05/84 "The Accubath TM Nitride--Etch. The Only True Refluxing Phosphoric Etcher".
Tseng et al.: *A New Oxidation-Resistant Self-Aligned TiSi$_2$ Process*, IEEE Electron Device Letters, vol. ED-L-7, No. 11, Nov. 1986.
Park et al.: *MO/Ti bilayer metallization for a self-aligned TiSi$_2$ Process*, J. Vac. Sci. Technol. A2(2), Apr.–Jun. 1984.
Lin et al.: *An Environment-Insensitive Trilayer Structure for Titanium Silicide Formation.* J. Electrochem. Soc.: Solid State Science, and Tech., vol. 133, No. 11, Nov. 1986.

*Primary Examiner*—David L. Lacey
*Assistant Examiner*—Thi Dang
*Attorney, Agent, or Firm*—Rodney M. Anderson; Douglas A. Sorensen; Melvin Sharp

[57] ABSTRACT

A capped silicide process which prevents reactions between the siliciding metal and oxygen contaminants and prevents silicon outdiffusion. In one form the process entails formation of a cap layer over the metal layer prior to performing the silicide reaction and subsequent removal of the cap layer with an isotropic etchant that does not degrade the underlying silicide.

5 Claims, 1 Drawing Sheet

ISOTROPIC ETCHANT FOR CAPPED SILICIDE PROCESSES

BACKGROUND

This invention relates generally to metal silicide technology and to improved methods of forming integrated circuits.

Self-aligned refractory metal silicide technology is recognized as one of the keys to sustaining good device performance in integrated circuitry as device dimensions are scaled down. In particular, titanium disilicide ($TiSi_2$) has become recognized as one of the most attractive metal silicides because of its low resistivity, stability and capability of self-aligned formation.

During the fabrication of high density integrated circuits the self-aligned silicidation process is generally performed after a polysilicon gate level has been patterned. This results in the formation of a highly conductive metallic silicide layer over all exposed areas of silicon, e.g., source/drain regions and polysilicon gates. As a result, source/drain diffusions can be made relatively shallow while maintaining acceptably low sheet resistance and the sheet resistance of polysilicon gates can also be minimized. Self-aligned processes for forming integrated circuits are well known in the art and are discussed at great length in U.S. Pat. No. 4,545,116 to Lau which is incorporated herein by reference.

In the past, manufacturing processes which utilize self-aligned silicide technology have required costly techniques to prevent formation of certain metallic oxides characterized by relatively high resistivity and poor etch selectivity relative to the silicide layer. By way of example, one of the most commonly used refractory metal silicides in the self-aligned process is titanium disilicide ($TiSi_2$). An undesirable by-product which often results when titanium is reacted to form silicide is titanium dioxide ($TiO_2$). $TiO_2$ has an extremely high heat of formation and, being a very stable compound, is very difficult to remove. In fact, efforts to remove $TiO_2$ from a circuit structure generally result in significant removal or degradation of the silicide layer.

$TiO_2$ is known to result from competing reactions with gaseous oxygen during silicide formation. Even the presence of minor amounts of ambient oxygen, e.g., 2 parts per million, during the silicide reaction result in formation of significant amounts of $TiO_2$. Common sources of oxygen include normal atmospheric contamination as well as the chemical break down of water vapor during the silicide reaction. In order to avoid oxygen contamination many IC manufacturing processes which incorporate silicide technology either utilize a noble gas such as argon to purge the oxygen or require that the silicide reaction be performed in a very low pressure, e.g., 0.45 Torr, environment. Because the purging process is costly and a low pressure ambient is difficult to maintain, it has been desirable to develop an environment insensitive silicide process which can be economically performed at atmospheric pressure.

Recently there has been disclosed a Capped Silicide Process wherein the problems of oxygen contamination are avoided by covering the metal layer with a cap material before performing the silicide reaction. In addition to preventing the formation of undesirable metallic oxides such as $TiO_2$, the capped silicide process also prevents outdiffusion of underlying silicon when the silicide reaction is performed at temperatures above 600° C. Techniques for performing self-aligned silicidation under oxide and nitride caps are discussed at great length in U.S. Pat. No. 4,690,730 and copending application Ser. No. 136,260, filed Dec. 22, 1987, each of which is assigned to the assignee of the present invention and is hereby incorporated by reference.

In certain applications of the Capped Silicide Process it is desirable, after forming silicide, to completely remove the cap material as well as portions of the metal layer which have not reacted to form silicide. For an oxide cap this has been accomplished with a two step etch, the first step involving a standard fluoro-etch chemistry, e.g., a combination of $CHF_3$ and $C_2F_6$, to anisotropically remove the cap material and the second step being a selective wet strip, e.g., $H_2O_2/H_2SO_4$, or $H_2O_2/NH_4OH$ with sonic agitation, to remove residual oxide and other nonsilicide material. The agitation is believed to aid in the undercutting of residual oxide and clearing out of undesirable conductive material along the sidewall filaments of polysilicon gates. This is believed to reduce the prevalence of electrical shorts between different moat regions.

With a silicon nitride cap, removal of cap material, as well as nonsilicided portions of the metal layer, has also been accomplished with a two step etch procedure. One known method comprises the step of applying a plasma etch, e.g., $CF_4/O_2$, again followed by a selective wet strip. Because the $CF_4/O_2$ plasma etch can be more isotropic than standard fluoro-etch chemistry, removal of nitride cap material along sidewall oxide filaments is believed to be more thorough than the removal of oxide cap material from similar locations. Thus sonic agitation may not be required during the nitride cap two step etch procedure.

While the above-described etch operations are capable of providing satisfactory results, it is preferred, particularly in a large scale manufacturing environment, to remove the cap material with a more isotropic etch process in order to more completely eliminate material which could contribute to formation of electrical shorts between different moat regions. The etch process should also be highly selective in order to avoid particulate problems associated with overetching and potential degradation of circuit elements.

SUMMARY OF THE INVENTION

According to the present invention there is provided a method of forming a silicide layer on a partially fabricated integrated circuit structure wherein the circuit structure comprises a plurality of exposed portions consisting essentially of silicon. The method comprises the steps of depositing a metal layer over exposed silicon portions; forming a cap layer over the metal layer to substantially isolate at least a portion of the metal layer from gaseous oxygen; next forming a conductive silicide layer by heating the silicon portions and the metal layer; and then removing the cap layer and nonsilicided portions of the metal layer with an isotropic etchant.

In a preferred form of the method the cap layer and nonsilicided portions of the metal layer are removed with the one step application of a highly isotropic wet etchant which exhibits great selectivity toward removal of the cap material while not degrading the silicide layer or gate oxide integrity.

BRIEF DESCRIPTION OF THE DRAWING

The invention may best be understood by reference to the following detailed description of illustrative embodiments when read in conjunction with the accompanying drawing, wherein.

DESCRIPTION OF THE PREFERRED EMBODIMENTS

Figure 1:
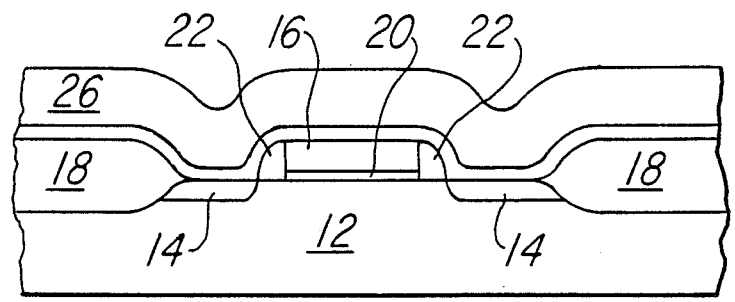
FIG. 1 illustrates a partially fabricated integrated circuit structure which has been covered with a cap layer prior to performing a self-aligned silicide reaction.

Although certain preferred embodiments of the invention are described herein it should be appreciated that the present invention is applicable to capped silicide processes generally, which processes can be embodied in a tremendous variety of integrated circuit structures including various forms of memory devices and logic circuits. Specific embodiments discussed herein are merely illustrative of ways to apply the inventive method and do not delimit the scope of the invention.

With reference to FIG. 1 there is illustrated a partially fabricated integrated circuit structure 10 comprising a silicon semiconductor layer 12, source/drain regions 14 and an overlying gate layer 16. The source/drain regions 14 are electrically isolated from other portions of the layer 12 by field isolation regions 18. Gate oxide material 20 and sidewall oxide filaments 22 electrically isolate the gate layer 16. A metal layer 24 is deposited overall in order to form silicide along the source/drain regions 1 and the gate layer 16.

The capped silicide process generally involves forming a layer of a cap material 26 over the metal layer 24 prior to the silicide reaction. Normally, the reaction may proceed at atmospheric pressure and a temperature up to 800° C. without concern for silicon outdiffusion or oxygen contamination. If the reaction is performed by rapid thermal processing the temperature may exceed 900° C. for short periods, e.g., less than one minute. Preferably, the cap layer 26 is chosen from the group of materials which:

(1.) prevent reactions between the siliciding metal and any gaseous oxygen which may be present in the reaction ambient.

(2.) provide a mechanism to prevent silicon outdiffusion through the silicide layer and/or through unreacted portions of the metal layer; and (3.) are removable without adversely affecting underlying layers of material which are to be retained.

It is also preferred that the cap material not react with the metal layer 24 at the silicide reaction temperature.

To prevent formation of a metallic oxide having high etch resistivity and poor selectivity relative to the silicide layer, the cap material should serve as a diffusion barrier to at least isolate select portions of the metal layer from gaseous oxygen. Furthermore, in order to enhance the ease with which the cap layer is selectively removed with respect to the silicide, the cap layer should predominantly comprise a material whose etch properties are not degraded by exposure to gaseous oxygen at the silicide reaction temperature.

In the preferred embodiment of the present invention the cap layer is essentially dielectric material. With a silicon nitride cap no formation of $TiSi_2$ by outdiffused silicon has been observed. The sheet resistance after a traditional low temperature silicide reaction, followed by a high temperature anneal, is at least comparable to that obtained in an oxygen free environment.

As disclosed in copending application Ser. No. 136,260, a general nitride cap process flow for siliciding a partially fabricated integrated circuit structure is as follows:

After the source/drain anneal, deposit a siliciding metal over exposed silicon portions;

Deposit 500 Angstroms of silicon nitride over the metal;

React the metal with the exposed silicon portions to form metallic silicide;

Remove the nitride layer without adversely affecting the conductive properties of the silicide layer.

A more specific nitride cap process flow resulting in formation of titanium silicide on the circuit structure is as follows:

After the source/drain anneal, deposit a 900 Angstrom Ti layer overall to cover exposed silicon portions;

Deposit a 500 Angstrom silicon nitride layer over the metal;

React the Ti with the exposed silicon portions to form $TiSi_2$;

Remove the nitride layer.

Preferably the nitride layer is deposited by plasma enhanced chemical vapor deposition (PECVD). Deposition temperatures between 300 and 400° C. provide a high quality nitride while avoiding reaction between Ti and $SiO_2$. More generally, the cap material is deposited at temperatures significantly above 25° C., i.e., room temperature, without forming $TiO_2$. Tests have been performed at 380° C. without observing formation of any $TiO_2$.

Clearly, the cap layer does not have to be pure $Si_3N_4$. However, cap layers formed primarily of dielectric material may be preferred in order to enhance etch selectivity and to avoid degrading circuit conductivity, e.g., by reducing the thickness of the silicide layer.

A feature of the present invention is that after the silicide reaction removal of the cap layer is accomplished with a one step etch process. The etchant is isotropic and exhibits a high degree of selectivity in order to avoid problems associated with overetching and potential degradation of circuit elements. For a nitride cap a suitable isotropic etchant has bee found to predominantly comprise phosphoric acid ($H_3PO_4$).

In the past, phosphoric acid etch processes have been used for removal of nitride patterns used in formation of field oxide regions along the silicon surface. A range of process conditions and relative etch rates of phosphoric acid with respect to silicon, silicon nitride and silicon oxide are presented in *J. Electrochem. Soc.: SOLID STATE SCIENCE*, Vol. 114, No. 8, August 1967. See, W. van Gelder, et al., "The Etching of Silicon Nitride in Phosphoric Acid with Silicon Dioxide as a Mask", p. 869. However, it is not believed that wet etch techniques for selectively removing silicon nitride from surfaces containing silicide compounds have previously been reported in the literature.

Through experimentation with temperature and acid concentration conditions it has been determined that a solution of phosphoric acid and water can be used to remove a silicon nitride layer without affecting the integrity of the titanium silicide. In a preferred form of the invention, an aqueous solution of boiling $H_3PO_4$, approximately 84 percent by weight, exhibits a relatively high etch selectivity between silicon nitride and titanium silicide ($TiSi_2$). In addition, application of the phosphoric acid etchant according to the method disclosed herein results in no significant degradation of the relatively thin underlying gate oxide. It has also been determined that the selectivity between the nitride and silicide layers is greater for plasma nitride which has been deposited at relatively low, e.g., 300° C., temperatures than for nitride deposited at 800° C.

Etch rates of exposed oxide are also sufficiently low so that the etch process can be applied to a wide variety of partially fabricated circuit structures without degrading device performance. Furthermore, acquired data suggests that lower temperature, i.e., below 150° C., applications of $H_3PO_4$, while providing lower etch rates in nitride, will exhibit even greater selectivities. Such substantially lower temperature processes are useful when extremely thin layers of oxide and/or silicide are exposed during the step of nitride removal. Of course there is a temperature limit below which essentially no etching of nitride will occur.

A preferred process flow for the one step etch is as follows:

1. After performing the silicide reaction under the nitride cap, deglaze the circuit structure to remove native oxide from the plasma nitride surface with a 0.5% buffered HF solution for 30 seconds.

2. Wash the slices in a quick dump rinse unit for four cycles using cold deionized water.

3. Dry the slices prior to the etch step in order to avoid acid spitting which may result from the acid bath.

4. Etch the slices in 84 percent $H_3PO_4$ at 150° C. to completely remove the nitride layer. (For 1000 Angstroms of plasma nitride deposited at 350° C. the etchant should be applied for 11–13 minutes. This corresponds to an etch rate of 90 Angstroms per minute.)

5. Wash the etched slices in a quick dump rinse unit for nine cycles using hot deionized water, e.g., greater than 65° C.

6. Spin (rinse) dry the surface.

Some degradation to the silicide film has been observed when etching in an 85 percent concentration $H_3PO_4$ bath boiling at 160° C. Significant degradation was observed at 170° C. Measured etch rates are presented in Table 1 for the above discussed materials. Table 1 also includes data for silicon nitride which has been deposited by low pressure Chemical Vapor Deposition (LPCVD) at 800° C.

Acid concentration can be maintained by boiling the bath in a reflux system. Otherwise, periodic water additions should be made.

TABLE 1

ETCH RATES MEASURED IN ANGSTROMS PER MINUTE FOR VARIOUS MATERIALS IN BOILING PHOSPHORIC ACID+

| | H3PO4 Bath Temperature | | | | | |
|---|---|---|---|---|---|---|
| | 140 C. | 150 C. | 160 C. | 170 C. | 180 C. | 190 C. |
| PECVD Silicon Nitride | 96 | 142 | 213 | 291 | 355 | * |
| LPCVD Silicon Nitride | * | 35 | 45 | 70 | 100 | 126 |
| Thermally Grown Silicon Dioxide | * | 0.6 | 1 | 2 | 5 | 8 |
| Polysilicon | * | 5 | 7 | 10 | 14 | 20 |
| Titanium Silicide | 5.8 | 17 | 28.5 | 42 | * | * |

+Temperatures of the boiling bath were stabilized with continual water additions
*Not measured Although removal of the native oxide has been suggested, this step may be omitted. However, failure to deglaze may result in etch nonuniformities. Furthermore, it should be noted that deglazes performed with concentrations of 49 percent HF have also resulted in nonuniform removal of plasma nitride.

If the silicide reaction temperature is less than 700° C., e.g., 675° C. for 30 minutes, two coexisting phases, i.e., C49 and C54, of $TiSi_2$ are created. C49, which is the predominant product at lower temperatures, does not possess the superior low conductivity properties of C54. To attain a more satisfactory level of conductivity it is desirable to subject the silicide to a higher temperature anneal after the unsilicided reactants are stripped away, i.e., a 30 minute 800° C. anneal should be performed after removal of undesired reaction products to convert C49 silicide to C54 silicide.

With the present invention it is also possible to form silicide at temperatures well above 700° C. without experiencing significant silicon outdiffusion problems. By way of example, the silicide reaction may be performed at 750° C. for 30 minutes. This will result in formation of C54 $TiSi_2$ as the dominant silicide product thus eliminating the requirement for an anneal step after removal of the Ti reaction products. The anneal step may also be eliminated by performing the silicide reaction under rapid thermal processing wherein the wafer is heated to a very high temperature, e.g., 900° C., for a short period, e.g., less than one minute.

As will be appreciated by those skilled in the art, the present invention can be widely modified and varied to conform to many applications and the scope of the invention is only to be limited by the claims which follow.

What is claimed is:

1. A method for removing silicon nitride from a substrate having silicon nitride and titanium silicide formed thereon comprising the steps of:
    providing a substrate with titanium silicide and silicon nitride formed thereon;
    exposing said substrate to phosphoric acid having a sufficient concentration and temperature for removing said silicone nitride without adversely affecting said titanium silicide so as to etch at least a portion of said silicone nitride, said etching of said silicone nitride occuring at a faster rate than said phosphoric acid etches said titanium silicide.

2. The method of claim 1 wherein said phosphoric acid is maintained at a temperature in the range of 140° C. to 180° C.

3. The method of claim 1 wherein said phosphoric acid solution is 84% phosphoric acid by weight.

4. A method as in claim 1 wherein said silicon nitride is formed on the surface of said titanium silicide.

5. A method as in claim 1 wherein said phosphoric acid is an aqueous solution of phosphoric acid.

* * * * *